(12) United States Patent
Kar et al.

(10) Patent No.: US 10,170,692 B2
(45) Date of Patent: Jan. 1, 2019

(54) SEMICONDUCTOR DEVICE WITH INTEGRATED MAGNETIC TUNNEL JUNCTION

(71) Applicant: IMEC VZW, Leuven (BE)

(72) Inventors: Gouri Sankar Kar, Leuven (BE); Jürgen Bömmels, Leuven (BE); Davide Crotti, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/387,127

(22) Filed: Dec. 21, 2016

(65) Prior Publication Data

US 2017/0179378 A1    Jun. 22, 2017

(30) Foreign Application Priority Data

Dec. 21, 2015   (EP) .................................... 15201487

(51) Int. Cl.
| | |
|---|---|
| *H01L 27/22* | (2006.01) |
| *H01L 43/08* | (2006.01) |
| *H01L 43/12* | (2006.01) |
| *H01L 43/02* | (2006.01) |

(52) U.S. Cl.
CPC .............. *H01L 43/08* (2013.01); *H01L 43/12* (2013.01); *H01L 43/02* (2013.01)

(58) Field of Classification Search
CPC .......... H01L 43/02; H01L 43/08; H01L 43/12
See application file for complete search history.

(56) References Cited

U.S. PATENT DOCUMENTS

| | | | | |
|---|---|---|---|---|
| 9,412,786 | B1 * | 8/2016 | Andre .................... | H01L 27/222 |
| 2005/0023581 | A1 * | 2/2005 | Nuetzel .................. | B82Y 10/00 |
| | | | | 257/295 |
| 2012/0228728 | A1 * | 9/2012 | Ueki ....................... | H01L 43/08 |
| | | | | 257/421 |
| 2014/0084398 | A1 * | 3/2014 | Oguz ...................... | H01L 43/12 |
| | | | | 257/421 |
| 2015/0243886 | A1 * | 8/2015 | Narayanan .......... | H01L 45/1233 |
| | | | | 257/3 |
| 2015/0311251 | A1 * | 10/2015 | Yi .......................... | H01L 27/222 |
| | | | | 257/421 |

OTHER PUBLICATIONS

Extended European Search Report dated Jun. 27, 2016, in European Application No. 15201487.4, in 7 pages.

* cited by examiner

*Primary Examiner* — Joseph Galvin, III
(74) *Attorney, Agent, or Firm* — Knobbe, Martens, Olson & Bear LLP

(57) ABSTRACT

The disclosed technology generally relates to semiconductor devices and more particularly to semiconductor devices having an integrated magnetic tunnel junction (MTJ), and relates to methods of fabricating the semiconductor devices. In one aspect, a semiconductor device includes a stack including successive layers of: a first metallization layer, a first dielectric layer, a second metallization layer, a second dielectric layer, and a third metallization layer. A magnetic tunnel junction (MTJ) device is formed in the first dielectric layer and in the second metallization layer and electrically connected to a first metallization layer and the third metallization layer.

19 Claims, 4 Drawing Sheets

SEMICONDUCTOR DEVICE WITH INTEGRATED MAGNETIC TUNNEL JUNCTION

CROSS-REFERENCE TO RELATED APPLICATIONS

This application claims foreign priority to European Patent Application No. EP 15201487.4, filed Dec. 21, 2015, content of which is incorporated by reference herein in its entirety.

BACKGROUND

Field

The disclosed technology generally relates to semiconductor devices and more particularly to semiconductor devices having an integrated magnetic tunnel junction (MTJ).

Description of the Related Technology

There is a growing interest in magnetoresistive random-access memory (MRAM) devices for various applications, as possible replacements for volatile memories, such as static random-access memories (SRAMs) and dynamic random-access memories (DRAMs), including, e.g., embedded DRAMs and embedded SRAMs. In addition, some MRAM devices, e.g., magnetic tunnel junction (MTJ) devices, can serve as a non-volatile memory device or a storage device for non-volatile storage of data. The MTJ devices can be integrated in a dielectric layer in the back-end-of-line (BEOL) part of the process flow, where they are interconnected by metal layers to form the desired electrical circuits. The BEOL processing involves forming metallization layers that are vertically separated by dielectric layers, where each metallization layer has formed therein interconnecting wires or lines that are isolated by a dielectric material. Further, via connections are formed to connect the metal layers to each other.

As the demand for smaller and faster semiconductor devices with higher memory density increases, there is a corresponding increase in a need for improved semiconductor devices having more advanced electrical routing.

SUMMARY OF CERTAIN INVENTIVE ASPECTS

An object of at least some of the embodiments of the present invention is to provide an improved semiconductor device wherein the MTJ device can be more efficiently integrated in the BEOL, and in particular in connection with more advanced technology nodes.

At least aspect of the disclosed technology is a semiconductor device and a method of fabricating the semiconductor device, each having the features defined by the claims.

According to a first aspect of the disclosed technology, a semiconductor device comprises a first metallization layer, a first dielectric layer arranged on the first metallization layer, a second metallization layer arranged on the first dielectric layer, a second dielectric layer arranged on the second metallization layer, and a third metallization layer arranged on the second dielectric layer. The first metallization layer is electrically connected to the second metallization layer by a via arranged in the first dielectric layer, and the second metallization layer is electrically connected to the third metallization layer by a via arranged in the second dielectric layer. Further, the semiconductor device comprises a magnetic tunnel junction, MTJ, device that is arranged in the first dielectric layer and the second device layer and is electrically connected to the first metallization layer and the third metallization layer.

According to a second aspect of the disclosed technology, a method comprises forming a first dielectric layer on a first metallization layer, and forming a second metallization layer on the first dielectric layer. The second metallization layer is electrically connected to the first metallization layer by a via arranged in the first dielectric layer. The method further comprises forming a MTJ device arranged in the first dielectric layer and the first metallization layer, forming a second dielectric layer on the second metallization layer, and forming a third metallization layer on the second dielectric layer, wherein the third metallization layer is electrically connected to the second metallization layer a via arranged in the second dielectric layer.

In prior art devices, wherein the MTJ device may be formed in the first dielectric layer, the thickness of the dielectric layer is limited by a minimum height of the MTJ device. As the minimum possible height of the MTJ device in turn may be determined by the configuration of the stack of layers required for forming the MTJ device, it may be difficult to reduce the height of the MTJ device below a certain value without compromising the performance of the MTJ device. The disclosed technology is based on the realization that by forming the MTJ device such that it extends not only in the first dielectric layer but also in the second metallization layer, the thickness of the dielectric layer can be reduced below the height of the MTJ device without risking to reduce the performance of the MTJ stack. The disclosed technology hence includes a semiconductor device wherein the MTJ device may be integrated in the first dielectric layer and the second metallization layer so as to allow for more advanced technology nodes, such as, e.g., 28 nm and below. The MTJ device may in other words be arranged in the extension of a via connection in the first dielectric layer.

The MTJ device may be fabricated in the back-end-of-line (BEOL) on, e.g., a metal line of the first metallization layer and arranged to extend through the first dielectric layer into the second metallization layer, wherein it may be electrically connected to the third metallization layer by, e.g., a via in the second dielectric layer. The MTJ may in other words be integrated on the first metallization layer at the memory area and at the same time in the second metallization layer at the logic area of the semiconductor device. As described herein, the back-end-of-line (BEOL) includes metallization layers and dielectric layers above the semiconductor substrate, or above contact vias contacting the substrate, e.g., gate, source or drain contact vias.

The MTJ device may be formed of a stack of a magnetic reference layer, or pinned layer, and a magnetic free layer separated by a barrier layer. The magnetic reference layer and the magnetic free layer may, e.g., comprise CoFeB, whereas the barrier layer may comprises MgO. The reference layer may be adapted to have a fixed magnetisation direction, and the free layer may be adapted to have a variable magnetisation direction. The intermediate barrier layer may be adapted to allow tunnelling of electrons between the reference layer and the free layer.

The relative magnetic orientation of the reference layer and the free layer may determine an electric resistance of the MTJ device. The MTJ device may have a relatively low resistance when the magnetisation of the reference layer and the free layer are aligned in parallel and a relatively high resistance when the magnetisation of the reference layer and the free layer, respectively, are anti-parallel. The difference in electric resistance may be used for storing information in the MTJ device.

The stack may be arranged such that the magnetic reference layer is formed, or electrically connected to, the first metallization layer and such that the magnetic free layer is electrically connected to the third metallization layer. Such configuration may be referred to as a bottom-pinned configuration. Alternatively, the stack may be arranged in an opposite configuration, with the free layer formed on or electrically connected to the first metallization layer and the reference layer electrically connected to the third metallization layer. Such configuration may be referred to as a top-pinned configuration.

The MTJ stack may be formed on a bottom electrode arranged on the first metallization layer. The bottom electrode may be adapted to provide a desired surface roughness, and in particular to provide a smoother surface as compared to the bare surface of the first metallization layer. A relatively smooth surface may be advantageous in subsequent processing steps, when the MTJ stack is formed. The bottom electrode may in some examples form part of the BEOL, whereas it in other examples may form part of the stack forming the MTJ device.

The MTJ device may be a spin-transfer torque (STT) MTJ device utilising spin-aligned electrons to directly torque the magnetic domains of the free layer. The STT MTJ device advantageously allows for a reduction of write currents.

The magnetic reference layer and the magnetic free layer may have a perpendicular magnetic anisotropy allowing for the size of the MTJ device to be reduced, which hence allows for a reduced thickness of the layers of the semiconductor device and a semiconductor device having an increased memory density.

The semiconductor device may, e.g., be, or form part of, a magnetoresistive random-access memory (MRAM) using the MTJ device for non-volatile storage of data.

As described throughout the specification, the term layer, e.g., used in the context of a metallization layer and a dielectric layer, may refer to specific levels or positions in the multilayer stack forming the semiconductor device. A metallization layer may therefore comprise both electrically conducting structures or regions, such as metal structures including metal lines and/or vias, and electrically insulating dielectric regions that electrically insulate the metal structures. The metal structures may, e.g., be formed as metal filled trenches in a dielectric material. Thus, the term metallization layer may refer to a layer comprising a dielectric material having metal structures. Preferably, the metallization layer may be formed of metal interconnecting wires that are electrically isolated or separated from each other by dielectric material. The term dielectric layer may refer to an electrically insulating layer structurally arranged between two metallization layers. However, a dielectric layer may also comprise electrically conducting structures or regions, such as metal vias, and electrically insulating dielectric regions that electrically insulate the metal vias.

In some embodiments, metal lines within a given metal layer may be formed using the same lithography mask, such that a minimum critical dimension (CD) of the metal lines within the given metal layer may be the same. Similarly, vias within a given metal layer may be formed using the same lithography mask, such that a minimum critical dimension (CD) of the vias within the given metal layer may be the same.

In some embodiments, metal vias within a given dielectric layer may be formed using the same lithography mask, such that a minimum critical dimension (CD) of the vias within the given dielectric layer may be the same.

As described herein, in some embodiments, a first metallization layer refers to the metallization layer that is the closest the semiconductor substrate, without intervening metallization layers. However, embodiments are not so limited and in other embodiments, a first metallization may have intervening metallization layers.

As described herein, in some embodiments, an (n+1)th metallization layer refers to a metallization layer that is immediately adjacent to an nth metallization layer. Similarly, an (n+1)th dielectric layer refers to a dielectric layer that is immediately adjacent to an nth dielectric layer According to an embodiment, the MTJ device may be arranged on-axis, i.e., on a metal line of the first metallization layer. The MTJ device may thereby be directly connected to the first metallization layer without any additional wiring or routing to the metal lines of the first metallization layer.

According to an embodiment, a total thickness of the first dielectric layer and the second metallization layer is less than 50 nm. By using relatively thin layers, the number of layers may be increased so as to allow for a larger number of, e.g., MTJ devices to be interconnected. Thus, a semiconductor device may be provided, having an increased memory density.

According to an embodiment, one or several of the metallization layers of the semiconductor device may be formed of a plurality of metal lines, or interconnecting wires, and a dielectric material. The metallization layer may, e.g., be formed by a subtractive method wherein a blanket film of metal is deposited first, patterned and then etched so as to define the interconnecting wires. The dielectric material may then be deposited over the wires. Alternatively, or additionally, the metallization layer may be formed by an additive method, also referred to as a Damascene process, wherein a dielectric layer is patterned with open trenches which are filled with a metal such as, e.g., copper. Copper may be advantageous over, e.g., aluminium, as copper may reduce the electrical resistance in the metallization layer. The trenches may be filled by depositing a coating of the metal, such as, e.g., copper, on the dielectric layer, wherein metal extending above the top of the dielectric layer (also referred to as overburden) may be removed by chemical-mechanical planarization (CMP). The CMP may leave the metal sunken within the trenches, such that a metallization layer with interconnecting wires embedded in an isolating material may be formed. The planarization of the layer may improve the flatness of the surface prior to subsequent processing steps. An improved flatness may, e.g., facilitate subsequent lithography steps.

According to an embodiment, the dielectric material of at least one of the first and second metallization layer may be a low-κ material having a relatively small dielectric constant relative to, e.g., silicon dioxide. The low-κ dielectric may reduce parasitic capacitance and crosstalk in the semiconductor device. Examples of low-κ materials may include, e.g., silicon dioxide doped with fluorine or carbon, porous silicon dioxide and organic polymeric dielectrics. Alternatively, or additionally, the low-κ material may be provided in the first dielectric layer and/or the second dielectric layer.

According to an embodiment, the MTJ device may be connected to a metal line of the third metallization layer by a via arranged in the second dielectric layer. The MTJ device may be arranged on-axis, i.e., beneath a metal line of the third metallization layer, such that the third metallization layer is connected to the first metallization layer by the via and the MTJ device.

It will be appreciated that other embodiments than those described above are also possible. It will also be appreciated that any of the features in the embodiments described for the semiconductor device according to the first aspect of the present invention may be combined with the manufacturing method according to the second aspect. Further objectives, or features of, and advantages with the present invention will become apparent when studying the following detailed disclosure, the drawings and the appended claims. Those skilled in the art will realise that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

All the figures are schematic, not necessarily to scale, and generally only show parts which are necessary to elucidate the embodiments of the disclosed technology, wherein other parts may be omitted or merely suggested.

DETAILED DESCRIPTION OF CERTAIN ILLUSTRATIVE EMBODIMENTS

The disclosed technology will now be described more fully hereinafter with reference to the accompanying drawings, in which exemplifying embodiments of the disclosed technology are shown. The disclosed technology may, however, be embodied in many different forms and should not be construed as limited to the embodiments set forth herein; rather, these embodiments are provided by way of example so that this disclosure will convey the scope of the invention to those skilled in the art. Furthermore, like numbers refer to the same or similar elements or components throughout.

Figure 1:
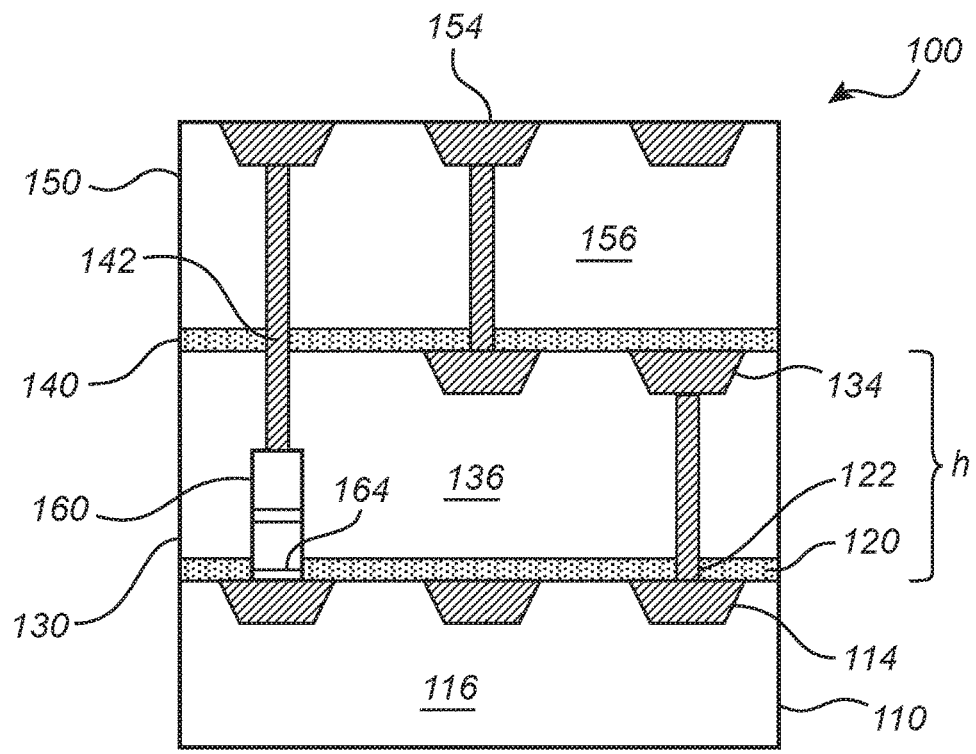
FIG. 1 schematically illustrates a cross-sectional side view of a portion of a semiconductor device comprising a magnetic tunnelling junction (MTJ) that is integrated in the first dielectric layer and the second metallization layer, according to embodiments.

With reference to FIG. 1, there is shown cross-sectional side view of a semiconductor device 100 according to an embodiment of the disclosed technology. The semiconductor device 100 may comprise a stacked structure of layers that may be arranged in the following order: a first metallization layer 110, a first dielectric layer 120, a second metallization layer 130, a second dielectric layer 140 and a third metallization layer 150. Further, an MTJ device 160 may be formed or integrated in the first dielectric layer 120 and the second metallization layer 130, and be electrically connected to the first metallization layer 110 and the third metallization layer 150. The MTJ device 160 may, e.g., comprise a bottom electrode 164 arranged at the interface with the first metallization layer 110.

The first metallization layer 110 may comprise metal lines 114 or conductor wires that are arranged in a dielectric material 116. The dielectric material 116 may, e.g., be a layer of silicon dioxide or a low-κ material. In one example, the metal lines 114 are formed by a damascene process, wherein trenches in the dielectric material 116 are filled with a metal such as, e.g., copper.

The first dielectric layer 120 may, e.g., comprise a layer of SiCN deposited on the first metallization layer 110 so as to separate the first metallization layer 110 and the second metallization layer 130. As shown in FIG. 1, the first dielectric layer 120 may comprise an MTJ device 160 arranged on a metal line 116 of the first metallization layer 110 and further extending into the second metallization layer 130.

Similarly to the first metallization layer 110, the second metallization layer 130 may comprise a layer of a dielectric material 136, such as a low-κ material or an ultra low-κ material, and metal lines 134 that are formed in trenches of the dielectric material 136. As described herein, a low-κ material refer to a dielectric material having a κ value between about 3.9 and about 3.0 or between about 3.5 and about 2.5. As described herein, an ultra low-κ material refer to a dielectric material having κ values between about 2.5 and about 1.5 or between about 2.0 and about 1.0. One or several of the metal lines 134 of the second metallization layer 130 may be electrically connected to a corresponding metal line 114 of the first metallization layer 110 by vias 122 arranged in or through the first dielectric layer 120.

The second dielectric layer 140 may be similarly configured as the first dielectric layer 120, and may hence be formed as a layer of, e.g., SiCN deposited on the second metallization layer 130. Subsequently, the third metallization layer 150 may be formed on the second dielectric layer 140 by, e.g., deposition of a dielectric material 156, such as, e.g., a low-κ material. The third metallization layer 150 may further comprise metal lines 154 that may be arranged in trenches of the dielectric material of the third metallization layer 150. Some of the metal lines 154 may be connected to the MTJ device 160 or a metal line 134 of the second metallization layer 130 by a via connections 142 arranged in or through the second dielectric material 140.

Thus, a semiconductor device 100 is provided wherein a minimum thickness of the first dielectric layer 120 is not limited to a maximum height of the MTJ device 160 (including any bottom electrodes 164 and a top electrode (not shown, contacting the via connection 142). As indicated in FIG. 1, the MTJ device 160 may have a height exceeding the thickness of the first dielectric layer 120 as long as the total thickness h of the first dielectric layer 120 and the second metallization layer 130 exceeds the height of the MTJ device.

Figure 2:
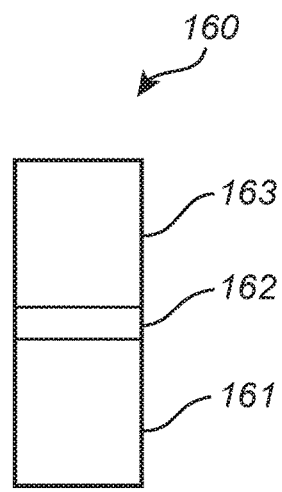
FIG. 2 schematically illustrates a cross-sectional side view of an MTJ of a semiconductor device, according to embodiments of the disclosed technology.

FIG. 2 schematically depicts a cross-sectional side view of an MTJ device according to an embodiment of the disclosed technology. The MTJ device may be integrated in a semiconductor device similarly configured as the device discussed with reference to FIG. 1. The MTJ device 160 may comprise of a stack of multiple layers, having, e.g., a magnetic reference or pinned layer 161, a barrier layer 162 and a magnetic free layer 163. It should be noted that the order of the magnetic reference layer 161 and the free layer 163 may be reversed such that the magnetic reference layer 161 is arranged above the magnetic free layer 163 in the stack. The magnetic reference layer 161 and the magnetic free layer 163 may, e.g., have a perpendicular magnetic anisotropy with a direction that can be altered between, e.g., two mutually opposing directions in the magnetic free layer 163. As described herein, an MTJ may be referred to as a perpendicular MTJ when it includes magnetic layers, e.g., the magnetic reference layer 161 and the magnetic free layer 163, that have a net magnetization or a direction of magnetic anisotropy whose direction is aligned along a vertical direction (e.g., layer normal direction) that is perpendicular to the planes formed by major surfaces of the ferromagnetic layers.

The reference layer 161 and the free layer 163 may be formed of, or at least comprise, CoFeB. The CoFeB may, e.g., be arranged in one or several layers in the reference layer 161 and/or the free layer 163. The barrier layer 162 may be formed of, or at least comprise, MgO configured to allow electrons to tunnel between the reference layer 161 and the free layer 163.

FIGS. 3a to e illustrate cross-sectional side views of a semiconductor device at different stages of a manufacturing process according to an embodiment. The resulting semiconductor device may be similarly configured as the devices discussed with reference to FIGS. 1 and 2.

Figure 3A:
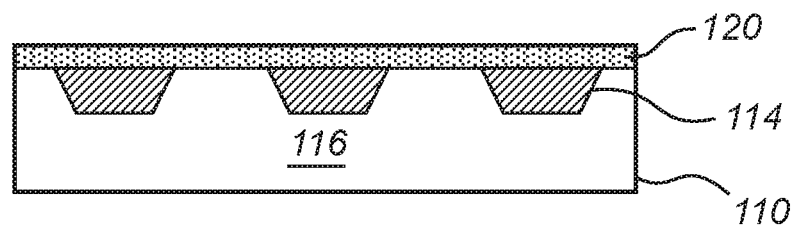
FIGS. 3a to 3e schematically illustrate cross-sectional side views of intermediate structures at various stages of fabrication of a semiconductor device comprising an MTJ, according to embodiments.

FIG. 3a shows a first metallization layer 110 comprising a dielectric material 116, such as, e.g., a low-κ material, in which trenches has been etched and filled with, e.g., copper 114. The overburden has then been removed by CMP such that a planar surface of the first metallization layer 110 is formed, having exposed conductive metal lines 114 embedded in the dielectric material 116. Subsequently, a layer of dielectric material, such as, e.g., 25 nm SiCN, has been deposited so as to form the first dielectric layer 120.

Figure 3B:
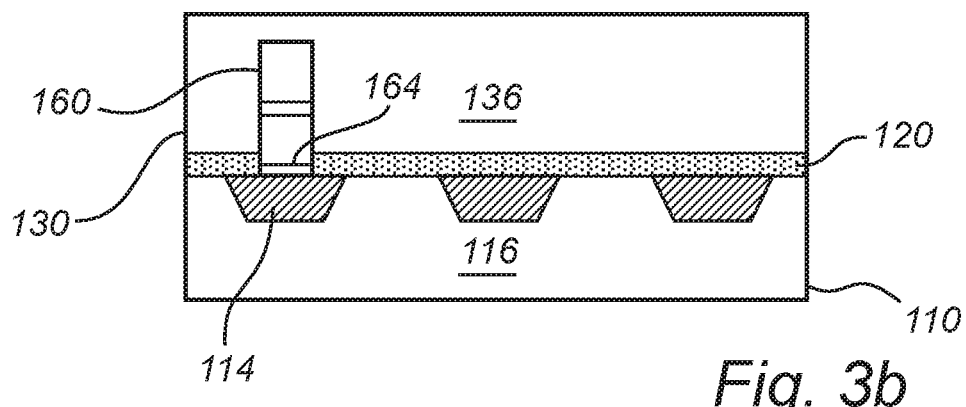

In FIG. 3b, an MTJ device 160 has been formed on a metal line 114 of the first metallization layer 110. The MTJ device 160 may, e.g., formed by depositing a stack of layers, forming the MTJ device 160, on the first dielectric layer 120 (which may have been formed with a trench at the intended position for the MTJ device 160, exposing the underlying metal line 114). A bottom electrode 164 may be formed on the metal line 114 prior to deposition of the stack. The deposited stack may then be etched through a hardmask so as to define the MTJ device 160, e.g., in the form of a pillar protruding from the surface of the first dielectric layer 120. As shown in FIG. 3b, the dielectric material 136 of the second metallization layer 130 may then be formed such that at least a portion of the MTJ device 160 protrudes into the dielectric material 136.

Figure 3C:
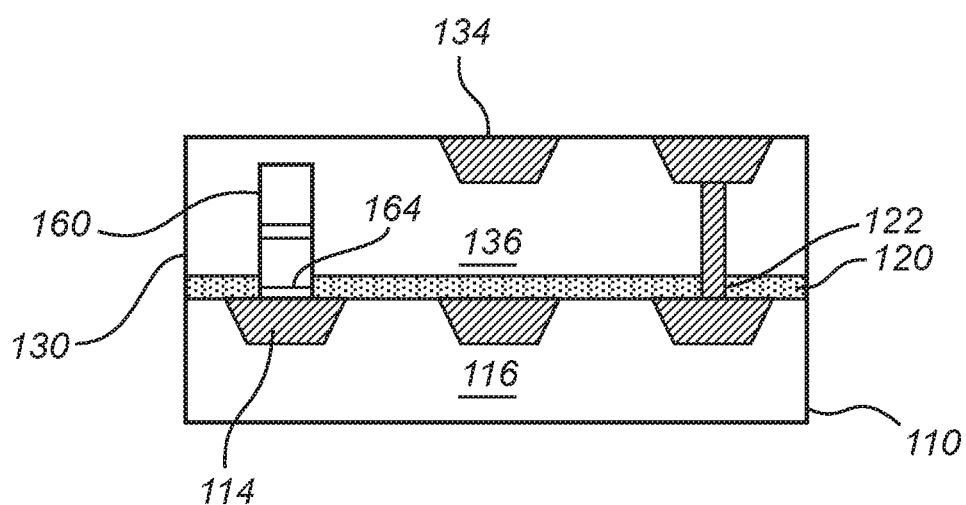

In FIG. 3c, the dielectric material 136 of the second metallization layer 130 has been formed with metal lines 134 arranged in trenches in a similar manner as described with references to the first metallization layer 110. The metal lines 134 may be defined by, e.g., a CMP process that may be stopped prior to the MTJ device 160 is exposed, i.e., leaving at least some of the dielectric material 136 on top of the MTJ device 160. Further, an electric interconnect 122, or via connection, has been formed so as to provide a connection between the second metallization layer 130 and the first metallization layer 110.

Figure 3D:
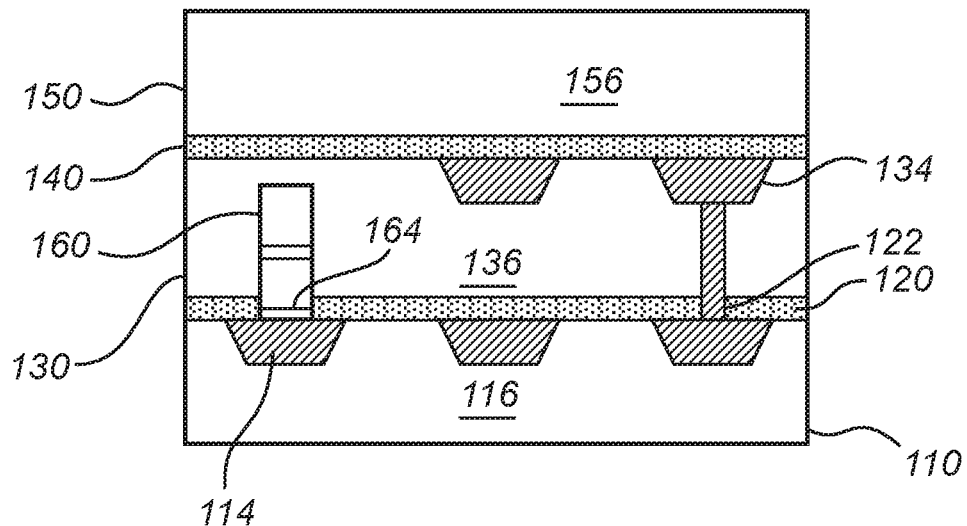
Figure 3E:
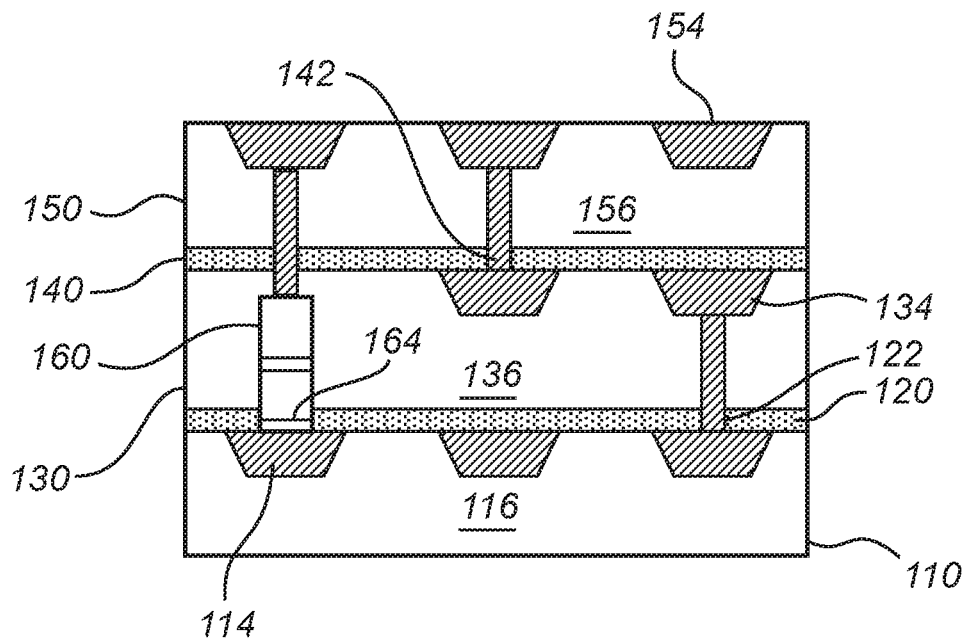

A dielectric material, such as, e.g., SiCN, may then be deposited so as to form the second dielectric layer 140 as shown in FIG. 3d, onto which a further layer of, e.g., the low-κ material 156 may be deposited to form the third metallization layer 150. Metal lines 154 may be formed in trenches in the third metallization layer 150 in a similar manner as described with reference to the first metallization layer 110 and the second metallization layer 130. Further, via connections 142 may be formed in order to provide an electrical connection between a metal line 154 of the third metallization layer 150 and the MTJ device 160, and a metal line 154 of the third metallization layer 150 and a metal line 134 of the second metallization layer 130.

Figure 4:
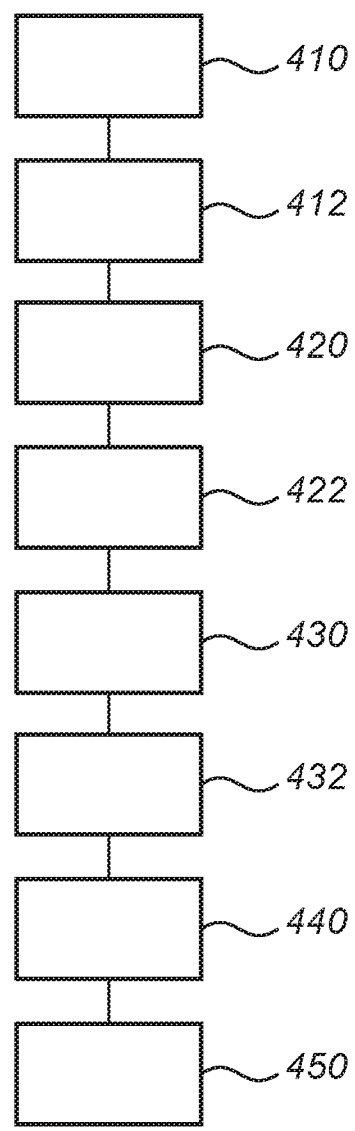
FIG. 4 is a block diagram illustrating a method of fabrication of a semiconductor device comprising an MTJ, according to embodiments.

FIG. 4 schematically illustrates a method for manufacturing a semiconductor device according to an embodiment of the disclosed technology. The semiconductor device may be similarly configured as the semiconductor devices described with reference to FIGS. 1 to 3e.

The method includes forming 410 a first dielectric layer on a first metallization layer, and forming 412 a via trench in the first dielectric layer to expose a metal line of the underlying first metallization layer. The method may further comprise forming 420 a second metallization layer on the first dielectric layer by depositing 422 a layer of a dielectric material in which an MTJ device and metal wires may be formed 430, 432. Further, a second dielectric layer may be formed 440, onto which a third metallization layer may be formed 450.

In conclusion, a semiconductor device and a method for manufacturing such as device is disclosed. The semiconductor device comprises an MTJ device that is electrically connected to a first metallization layer and a third metallization layer, and integrated into a first dielectric material and a second metal layer of the semiconductor device.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

What is claimed is:

1. A semiconductor device, comprising:
   a first metallization layer;
   a first dielectric layer formed on the first metallization layer;
   a second metallization layer formed on the first dielectric layer;
   a second dielectric layer formed on the second metallization layer;
   a third metallization layer formed on the second dielectric layer,
   wherein the first metallization layer is electrically connected to the second metallization layer by a first via formed in the first dielectric layer, and
   wherein the second metallization layer is electrically connected to the third metallization layer by a via formed in the second dielectric layer; and
   a magnetic tunnel junction (MTJ) device formed in the first dielectric layer and extending into the second metallization layer, the MTJ device including a top electrode and a bottom electrode,
   wherein the bottom electrode of the MTJ device is electrically connected to the first metallization layer,
   wherein the second via directly connects the top electrode of the MTJ device to the third metallization layer, and
   wherein the height of the MTJ device exceeds the length of the first via formed in the first dielectric layer.

2. The semiconductor device according to claim 1, wherein the MTJ device is formed on a metal line of the first metallization layer.

3. The semiconductor device according to claim 2, wherein the metal line of the first metallization contacts the bottom electrode of the MTJ, and wherein the second via contacts the top electrode of the MTJ.

4. The semiconductor device according to claim 3, wherein the second via formed in the second dielectric extends through the second dielectric.

5. The semiconductor device according to claim 4, wherein the second via extends partially through a dielectric region of the third metallization layer and partially through a dielectric region of the second metallization layer, such that the second via extends between the top electrode of the MTJ and a metal line of the third metallization layer.

6. The semiconductor device according to claim 1, wherein the combined total thickness of the first dielectric layer and the second metallization layer is less than 50 nm.

7. The semiconductor device according to claim 1, wherein the second metallization layer comprises a plurality of second metal lines and a second dielectric material, wherein the second dielectric material comprises first trenches formed therein in which the plurality of second metal lines are formed.

8. The semiconductor device according to claim 7, wherein the second dielectric material of the second metallization layer is formed of a low-K material.

9. The semiconductor device according to claim 8, wherein the third metallization layer comprises a plurality of third metal lines and a third dielectric material, wherein the third dielectric material has third trenches formed therein in which the plurality of third metal lines are formed.

10. The semiconductor device according to claim 9, wherein the MTJ device is connected to a metal line of the third metallization layer by the second via.

11. The semiconductor device according to claim 1, wherein the MTJ device is integrated as part of a back end of line (BEOL) process flow.

12. The semiconductor device according to claim 1, wherein the MTJ device is a perpendicular MTJ device.

13. A method of fabricating a semiconductor device, comprising:
   forming a first dielectric layer on a first metallization layer;
   forming a second metallization layer on the first dielectric layer, the second metallization layer being electrically connected to the first metallization layer by a first via formed in the first dielectric layer;
   forming an MTJ device in the first dielectric layer and on the first metallization layer, the MTJ including a top electrode and a bottom electrode;
   forming a second dielectric layer on the second metallization layer; and
   forming a third metallization layer on the second dielectric layer, the third metallization layer being electrically connected to the second metallization layer by a second via formed in the second dielectric layer,
   wherein the bottom electrode of the MTJ device is electrically connected to the first metallization layer, and
   wherein the second via directly connects the top electrode of the MTJ device to the third metallization layer.

14. The method according to claim 13, wherein forming the MTJ device comprises:
   forming a via trench in the first dielectric layer to expose a metal line of the underlying first metallization layer;
   providing a stack of layers of the MTJ device in the via trench, the stack of layers having a height exceeding a thickness of the first dielectric layer;
   providing a dielectric material at least partly enclosing the stack of layers of the MTJ device; and
   forming a second metallization layer in the dielectric material.

15. The method according to claim 14, wherein forming the first dielectric layer and forming the second metallization layer comprises providing a combined total thickness of the first dielectric layer and the second metallization layer that is less than 50 nm.

16. The method according to claim 13, wherein forming the MTJ device comprises forming a perpendicular MTJ device.

17. The method according to claim 13 wherein forming the MTJ device comprise forming in a back end of line (BEOL) process flow.

18. The semiconductor device according to claim 1, wherein the MTJ device comprises a magnetic free layer, a barrier layer and a magnetic pinned layer formed between the top and bottom electrodes.

19. The semiconductor device according to claim 1, wherein the bottom electrode of the MTJ device directly contacts a metal line of the first metallization layer, and wherein the second via directly contacts a metal line of the third metallization layer and the top electrode of the MTJ.

* * * * *